United States Patent [19]

Estrick et al.

[11] Patent Number: 4,704,737
[45] Date of Patent: Nov. 3, 1987

[54] COMPRESSIVE RECEIVER HAVING PULSE WIDTH EXPANSION

[75] Inventors: Vaughn H. Estrick, Fullerton; Robert N. Guadagnolo, Burbank, both of Calif.

[73] Assignee: Hughes Aircraft Company, Los Angeles, Calif.

[21] Appl. No.: 781,288

[22] Filed: Sep. 27, 1985

[51] Int. Cl.⁴ .............. G01R 23/175; G01S 7/02; H03K 5/06; H04K 3/00

[52] U.S. Cl. .................. 455/226; 455/146; 455/147; 342/132

[58] Field of Search ............ 455/145, 146, 147, 226; 342/132; 324/80; 375/94, 96

[56] References Cited

U.S. PATENT DOCUMENTS

| | | | |
|---|---|---|---|
| 2,882,395 | 4/1959 | White | 455/145 |
| 2,897,442 | 7/1959 | Wright et al. | 455/146 |
| 2,954,465 | 9/1960 | White | 455/146 |
| 3,283,080 | 11/1966 | Caputi | 381/29 |
| 3,354,456 | 11/1967 | Caputi | 342/132 |
| 3,896,398 | 7/1975 | Ueki | 332/7.51 |
| 3,950,607 | 4/1976 | Southworth et al. | 178/6 |
| 3,955,137 | 5/1976 | Harrington et al. | 324/80 |
| 4,109,278 | 8/1986 | Mendrala et al. | 358/22 |
| 4,200,840 | 4/1980 | Tsui | 455/226 |
| 4,204,165 | 5/1980 | Ready | 455/226 |
| 4,216,433 | 8/1980 | LeGrand | 328/111 |
| 4,238,773 | 12/1980 | Tsuboka et al. | 358/183 |
| 4,296,319 | 10/1981 | Franks et al. | 250/227 |
| 4,331,971 | 5/1982 | Bretl | 358/37 |
| 4,410,980 | 10/1983 | Takasaki et al. | 370/109 |

OTHER PUBLICATIONS

Butson et al, "Theoretical Assessment of the Use of Pulse Compression in a Panoramic Receiver", Proc. IEE, vol. 113, No. 5, May 1966, pp. 725-739.
James Bao-yen Tsui, (Avionics Laboratory, Air Force Wright Aeronautical Laboratories) Microwave Receivers and Related Components, Chp. 6, pp. 119-147.
International Search Report—PCT/US 86/01864.
Modern Radar, Chp. 2, pp. 218-244, "Linear FM Pulse Compression".
Radio Engineering and Electronic Physics, vol. 12, No. 10, 1967 by A. F. Protopopof, pp. 1627-1635.
Radio Engineering and Electronic Physics, vol. 14, No. 3, 1969 "Calculation of the Duration of Output Pulses from a Compression Filter" by A. S. Protopopov, pp. 392-396.

*Primary Examiner*—Jin F. Ng
*Assistant Examiner*—Melvin C. Marcelo
*Attorney, Agent, or Firm*—A. W. Karambelas

[57] ABSTRACT

A broadband receiver for converting an input radio frequency signal into output pulses includes provision for expanding the width of the output pulses (50) to permit pulse processing by conventional equipment at slower processing rates. A scanning local oscillator (42) frequency modulates the input signal to create a frequency modulated signal which is compressed into a pulse by a dispersive delay line (40). The width of the output pulse is increased by producing a mismatch or differential in the frequency versus time slopes (52, 54) of the oscillator and dispersive delay line. The slope differential is achieved by a function generator (58, 68) which maintains the frequency versus time slope of the scanning local oscillator at a value different than that produced by the dispersive delay line.

13 Claims, 10 Drawing Figures

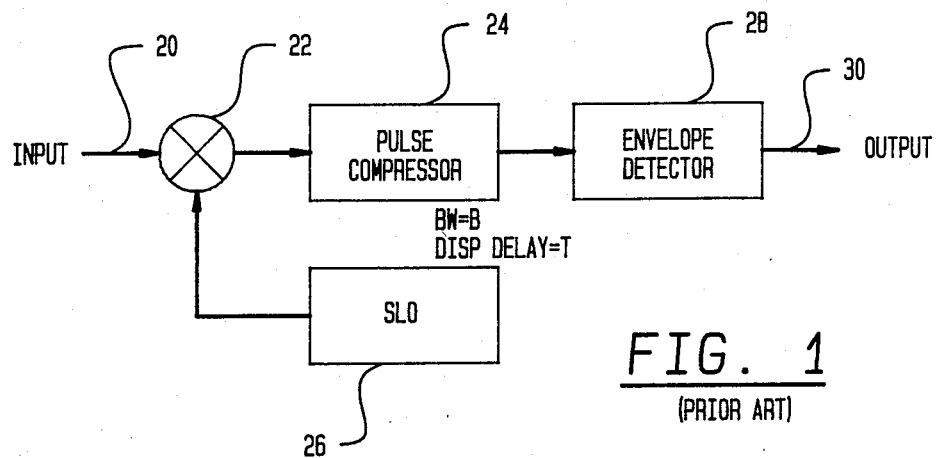
FIG. 1 (PRIOR ART)
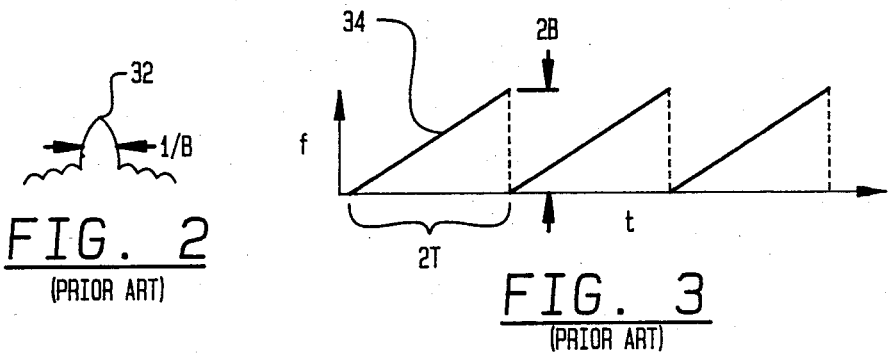
FIG. 2 (PRIOR ART)
FIG. 3 (PRIOR ART)
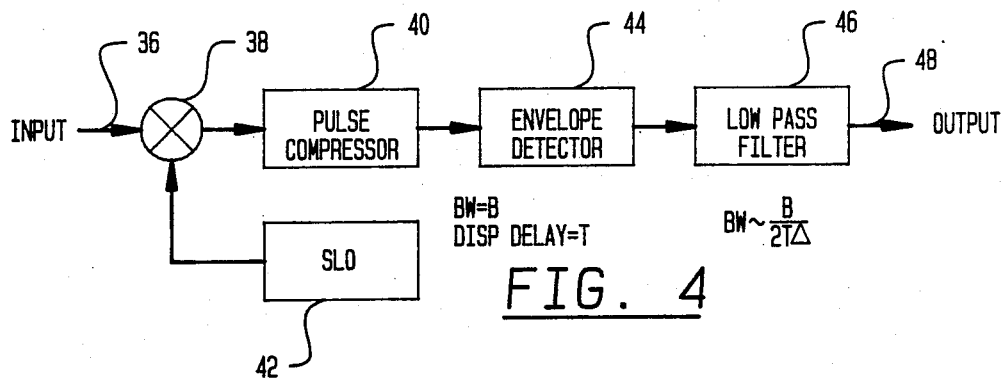
FIG. 4

COMPRESSIVE RECEIVER HAVING PULSE WIDTH EXPANSION

TECHNICAL FIELD

The present invention broadly relates to broadband receivers, particularly of microwave frequency, and deals more specifically with a compressive receiver of the type which compresses an input radio frequency signal into a narrow pulse.

BACKGROUND ART

Compressive receivers, sometimes referred to as microscan receivers, are broadband devices primarily operating in the microwave frequency range and are often employed to intercept any of various types of signals such as radar and communication signals in a dense signal environment.

Compressive receivers use a dispersive delay line (DDL) for compressing into a narrow pulse a frequency modulated (FM) signal which is generated from an input radio frequency (RF) signal. A fast sweeping local oscillator (SLO) is employed to convert the input signal into an FM signal. By measuring the positions of the output pulses in the time domain, the frequency of the input signal can be obtained.

The DDL possesses an inherent differential delay time and frequency separation or bandwidth. The time-bandwidth product of a DDL is the differential delay time multiplied by the bandwidth. The time-bandwidth product is an important characteristic which determines the processing gain of a compressive receiver. The differential delay time is related to the frequency resolution of the receiver, and the bandwidth of the DDL is related to the input bandwidth and the probability of intercept of the receiver.

The SLO possesses a frequency versus time slope which matches that of the DDL in amplitude but is opposite in sign. An RF input signal with constant frequency is converted to a linear FM signal at the output of a mixer in which the input signal is combined with the frequency sweep generated by the SLO. This signal is often modified by a weighting filter and is then compressed in the time domain into a pulse at the output of the DDL. A detector is employed to sense the amplitudes of the output pulses from the DDL, and determines the relative positions of the pulses in the time domain.

The width of the output pulses limits the use of wideband compressive receivers to those applications where high speed circuitry is available for processing the relatively narrow output pulses. In the past, in order to process the narrow output pulses, it has been necessary to employ video pulse stretching circuitry to increase pulse width or other high speed phased clocking circuitry to handle the short pulses.

The present invention is directed to eliminating the need for the special processing circuitry mentioned above by providing a system for increasing the width of the output pulses.

SUMMARY OF THE INVENTION

According to the present invention, a system is provided for converting an input radio frequency signal into an output pulse in which the width of the output pulse is increased to permit pulse processing by slower speed, conventional circuits. The input radio frequency signal is mixed with a sweep of frequencies from a scanning local oscillator having a frequency versus time slope $s_1$, thereby producing a frequency modulated signal. The frequency modulated signal is delayed by a dispersive delay device having a frequency versus time delay slope of $s_2$, thereby producing the compressed pulse. In prior techniques, the slopes $s_1$ and $s_2$ are normally equal in magnitude but opposite in sign. However, in accordance with the present invention, a differential is created between the slopes $s_1$, $s_2$, which in turn results in expansion of the pulse by the dispersive delay device and a corresponding increase in the width of the output pulse. In the preferred form of the invention, the frequency versus time slope differential is created by altering the slope of the frequency sweep produced by a scanning local oscillator. The slope alteration may be achieved using a function generator which controls the frequency versus time characteristics of the scanning local oscillator.

BRIEF DESCRIPTION OF THE DRAWINGS

FIG. 1 is a block diagram of a typical prior art compressive receiver;

FIG. 2 is a waveform of an output pulse produced by the prior art compressive receiver shown in FIG. 1;

FIG. 3 is a waveform of the frequency sweep produced by the scanning local oscillator forming part of the prior art compressive receiver of FIG. 1;

FIG. 4 is a block diagram of a compressive receiver having pulse width expansion which forms the preferred embodiment of the present invention;

DESCRIPTION OF THE PREFERRED EMBODIMENTS

Figure 5:
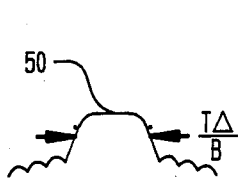
FIG. 5 is a waveform of the expanded output pulse produced by the compressive receiver shown in FIG. 4.

Referring first to FIGS. 1–3 of the drawings which disclose a typical prior art compressive or microscan receiver, the input 20 to the receiver is a continuous wave radio frequency signal which may consist of, by way of example, a frequency division multiplexed (FDM) signal. The input signal 20 is delivered to a mixer 22 where it is mixed with a sweep of frequencies generated by a scanning local oscillator (SLO) 26. The input signal 20, thus is effectively frequency modulated by the SLO 26 so that the output of the mixer 22 is a frequency modulated signal. The frequency modulated signal is processed by a pulse compressor 24 which may consist of a dispersive delay line (DDL) in which the delay time imposed on the frequency modulated signal is linearly related to the frequency. The DDL may consist, by way of example, of a surface acoustic wave device in which the time delay is either monotonously increased with increasing frequency or monotonously decreased with increasing frequency. In any event, the output of the pulse compressor 24 is a relatively narrow pulse whose position in the time domain corresponds to the frequency of the input signal 20.

If desired, a weighting filter (not shown) may be employed between the mixer 22 and pulse compressor 24 in order to shape the signal from the mixer 22 into a desired shape prior to processing by the pulse compressor 24.

The amplitudes of the pulses 32 (FIG. 2) output by the pulse compressor 24 are detected by an envelope detector 28 and the resulting output signal is delivered at the output 30.

The receiver partially shown in FIG. 1 has an instantaneous bandwidth B and time frame T. The SLO 26 produces a frequency sweep 34 (FIG. 3) having a time extent 2T and a frequency range or bandwidth 2B. Thus, an input signal 20 to the receiver consisting of a continuous wave will result in an output pulse 32 (FIG. 2) having a width 1/B. For example, a 1 GHz input signal results in a 1 nanosecond output pulse. The slope of the frequency sweep 34 is identical to but opposite in sign of the frequency versus time delay imposed by the pulse compressor 24.

Figure 6:
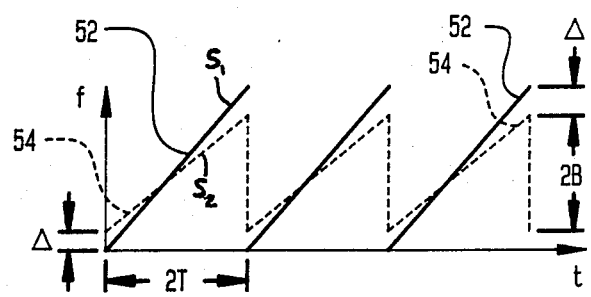
FIG. 6 is a waveform of the frequency sweep produced by the scanning local oscillator of the receiver of FIG. 4, the frequency versus time slope of the pulse compressor being shown in dotted lines.

Referring now to FIGS. 4-6, the present invention relates to a compressive receiver having a provision for expanding the width of the compressed output pulses. The continuous wave RF input signal is delivered to an input 36 of a mixer 38. The input signal 36 is mixed with a frequency sweep generated by a scanning local oscillator 42 to produce a frequency modulated signal which is delivered from the output of the mixer 38 to a pulse compressor 40. The pulse compressor 40 in one embodiment consists of a dispersive delay line which introduces a delay into the signal as a function of frequency, thereby compressing the signal into a pulse. The pulse is delivered to an envelope detector 44 similar to that previously described, and thence to a low pass filter 46 which functions to reject the IF (intermediate frequency) carrier frequency and the resulting, filtered signal is delivered to the output 48 for further processing. In the case of an FDM input signal, the output consists of a series of pulses whose positions in the time domain respectively correspond to the frequencies of the input signal.

The SLO 42 generates a frequency sweep indicated by the numeral 52 in FIG. 6 which has a time extent 2T and a slope $s_1$. Also indicated in FIG. 6 at 54 is the delay as a function of frequency introduced by the pulse compressor 40 but shown in opposite sign. The frequency versus time delay 54 has a bandwidth of 2B having a slope $s_2$. Thus, the slopes $s_1$ and $s_2$, which represent rates of change of frequency with respect to time, are different in magnitude creating a slope differential or delta ($\Delta$) at the extremities of the time extent 2T. This mismatch between the slopes $s_1$ and $s_2$ prevents the pulse compressor 40 from fully compressing the pulse. By selecting an appropriate amount of slope mismatch, $\Delta$, the resultant pulse output 50 (FIG. 5) can be stretched or increased in width by an amount T$\Delta$. For example, if B equals 1000 MHz, then the resultant output pulse width from a conventional prior art pulse receiver would be 1 nanosecond. By choosing $\Delta$ equal to 25 MHz and T equal to 200 nanoseconds, the resultant output pulse 50 would be 5 nanoseconds.

The output bandwidth of the compressive receiver shown in FIG. 4 is proportional to the bandwidth B/2T$\Delta$, and the widths of the output pulse 50 (FIG. 5) is T$\Delta$/B.

It may thus be appreciated that any processor which operates on the output pulses 50 may be slower in terms of processing time in order to process the wider pulse signals. The increase in pulse width may reduce the theoretical frequency resolution of the receiver, but for many applications this resolution reduction is acceptable in order to obtain wide instantaneous bandwidth. For example, for a given input signal strength, the resultant peak output power from the pulse compressor 40 is reduced by a factor of five in the example mentioned above, or about 7 dB, thereby degrading the effective sensitivity by this amount. However, by adding a low pass filter 46 with a bandwidth of 100 MHz the output signal-to-noise ratio is improved approximately 3.5 dB, thus resulting in only a 3.5 dB loss in sensitivity.

Figure 7:
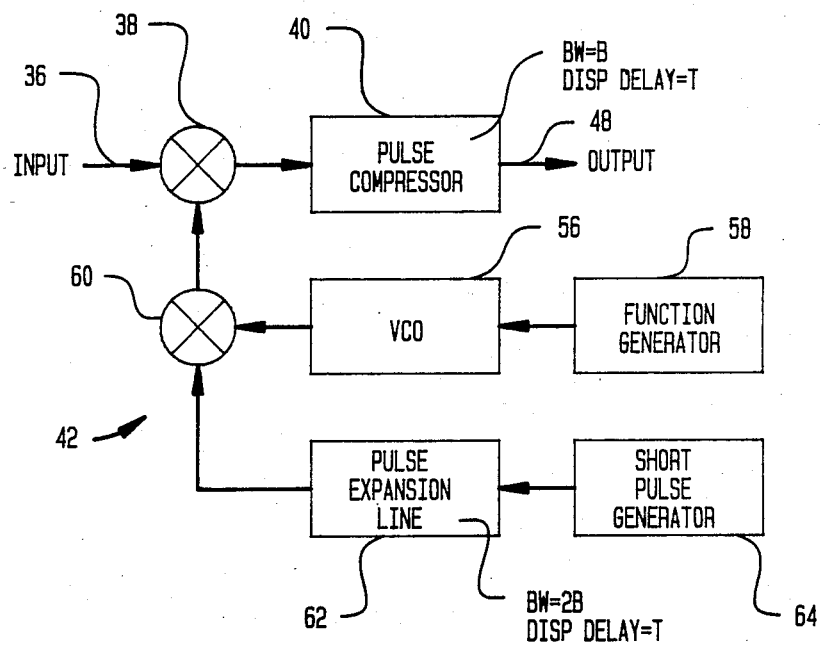
FIG. 7 is a block diagram of a compressive receiver according to the present invention showing one form of scanning local oscillator.
Figure 8:
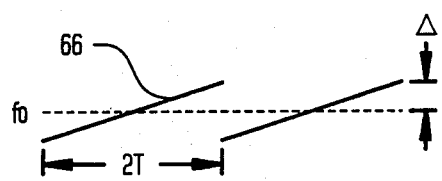
FIG. 8 is a waveform of the frequency sweep produced by the VCO of the receiver of FIG. 7.

Attention is now directed to FIGS. 7-10 which depict various techniques for implementing the frequency versus time slope mismatch discussed above. For purposes of simplification, the envelope detector, low pass filter, weighting filters and similar conventional components are not depicted in these views. As shown in FIG. 7, the SLO 42 includes a VCO (voltage controlled oscillator) 56, function generator 58, mixer 60, pulse expansion line 62 and a short pulse generator 64. The pulse expansion line 62 is a conventional dispersive delay device having a bandwidth 2B and a dispersive delay T. The pulse expansion line 62 is driven by short pulses from the short pulse generator 64. The expanded pulses output by the pulse expansion line 62 are combined in the mixer 60 with the output of the VCO 56 which is swept at a rate $\Delta$T by the function generator 58. The function generator 58 may comprise a hard wired circuit or data stored in a memory which function to output data corresponding to a voltage which sweeps the VCO 56 at the proper rate. The VCO 56 is swept at a rate which is synchronized with the pulses output from the short pulse generator 64. FIG. 8 depicts the sweep 66 provided by the function generator 58 which is used to sweep the VCO 56 with a triangular (sawtooth) waveform. The sweep 66 has a time extent 2T and a slope above the center frequency $f_0$ of $\Delta$; this extra "chirp", $\Delta$, of sweep is added to the output of the pulse expansion line 62 by the mixer 60.

Figure 9:
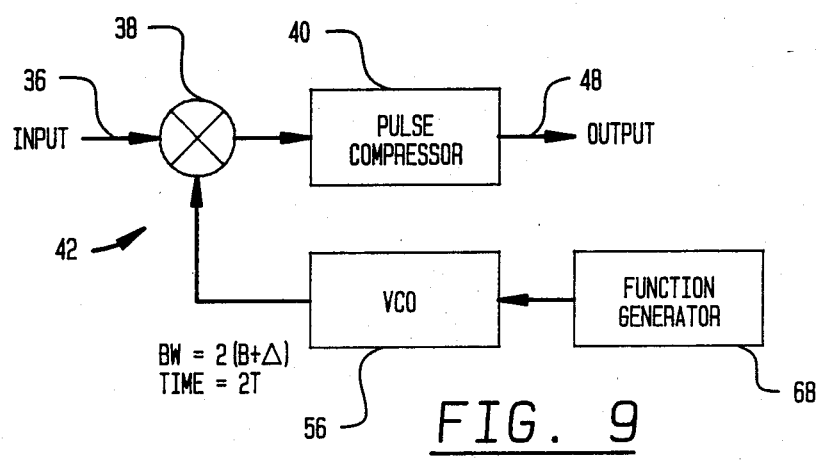
FIG. 9 is a block diagram of a compressive receiver according to the present invention employing another form of a scanning local oscillator; and, FIG. 10 is a block diagram of a compressive receiver according to the present invention which employs still another form of sweeping local oscillator.

The SLO 42 shown in FIG. 9 comprises a VCO 56 which is swept by a function generator 68. In this particular embodiment, the function generator generates the entire sweep which has a bandwidth of 2B plus 2$\Delta$ in a frequency over a time extent 2T. Thus, it is not necessary to use the supplemental pulse expansion line and short pulse generator of the embodiment shown in FIG. 7. In other words, the VCO 56 provides the entire FM chirp which is combined with the input signal 36 at the mixer 38.

Figure 10:
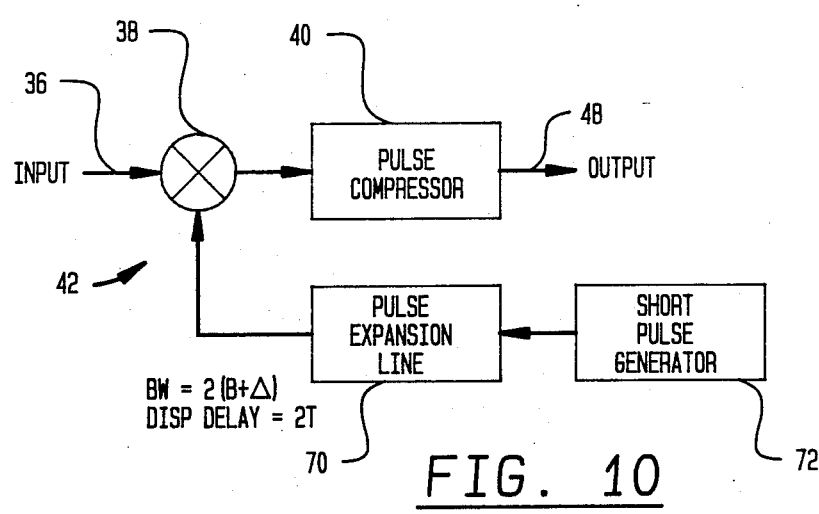

FIG. 10 depicts an embodiment of SLO 42 which comprises a pulse expansion line 70 controlled by a short pulse generator 72. The pulse expansion line 70 may consist, for example, of a surface acoustic wave device having a frequency versus time delay of the proper slope, determined by the pulse generator 72, so as to result in the desired mismatch with the time-frequency slope generated by the pulse compressor 40.

It is recognized that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. In a compressive receiver for compressing an input radio frequency signal into an output pulse and of the type including the combination of means for converting said input signal into a frequency modulated signal, said converting means being characterized by a frequency versus time slope $s_1$, a dispersive delay line for converting said frequency modulated signal into a pulse, said dispersive delay line being characterized by a frequency versus time slope $s_2$, the slopes $s_1$ and $s_2$ normally being equal in magnitude but opposite in sign, the improvement wherein:

said converting means includes means for generating a differential in the magnitudes of the slopes $s_1$ and $s_2$, said differential resulting in a corresponding increase in the width of said output pulse.

2. The improvement of claim 1, wherein said generating means includes:

first means for producing a first sweep signal having a frequency versus time slope substantially equal to said differential, second means for producing a second sweep signal having a frequency versus time slope substantially equal to but opposite in sign to slope $s_2$, and means for combining said first and second sweep signals to thereby provide a sweep signal having the slope $s_1$.

3. The improvement of claim 2, wherein:

said first means includes a voltage controlled oscillator and means for sweeping said oscillator over a range of frequencies, and said second means includes means for generating a series of pulses and means for dispersing said pulses as a function of time.

4. The improvement of claim 1, wherein said generating means includes a voltage controlled oscillator for producing an output signal which varies in frequency in accordance with an input voltage signal and means for producing said input voltage signal.

5. The improvement of claim 1, wherein said generating means includes means for producing a series of pulses and means for expanding said pulses as a function of time.

6. A receiver for converting a plurality of radio frequency input signals of differing frequencies into a plurality of output pulses, the positions of the output pulses in the time domain respectively corresponding to the frequencies of the input signals, comprising:

means for generating a frequency sweep signal in which the frequencies change over a period of time at a first rate;

means for combining said input signals with said frequency sweep signal to form a frequency modulated signal; and, means for delaying the change in frequency of said frequency modulated signal at a second preselected rate to form said output pulses, said first and second rates being different in magnitude to form a differential rate of change with respect to time, said differential rate of change resulting in an expansion of the width of said output pulses over that which would be caused if the first and second rates of change were the same.

7. The receiver of claim 6, wherein said generating means includes:

first means for producing a first variable frequency signal having a frequency versus time relationship substantially equal to said differential rate of change, second means for producing a second variable frequency signal having a frequency versus time relationship substantially equal to the difference between said second preselected rate and said differential, and means for mixing said first and second variable frequency signals to form said frequency sweep signal.

8. The receiver of claim 6, wherein said generating means includes an oscillator having a variable frequency output and a voltage controlled input and means for generating a voltage control signal for controlling said input of said oscillator.

9. The receiver of claim 6, wherein said generating means includes means for generating a series of pulses and means for expanding said pulses in the time domain.

10. In a method of converting an input radio frequency signal into an output pulse which includes the steps of mixing said input signal with a sweep of frequencies having a frequency versus time slope $s_1$ to thereby produce a frequency modulated signal, delaying said frequency modulated signal with a frequency versus time delay slope of $s_2$ to produce said pulse, the slopes $s_1$ and $s_2$ normally being equal in magnitude but opposite in sign, the improvement comprising:

increasing the width of said output pulse by producing a differential between the slopes $s_1$ and $s_2$.

11. The improved method of claim 10 wherein said slope differential is produced by increasing the magnitude of the slope $s_1$ over the magnitude of slope $s_2$.

12. The improved method of claim 10, wherein said slope differential is produced by generating a first frequency sweep signal having a frequency versus time slope generally equal to $s_2$, generating a second frequency sweep signal having a frequency versus time slope generally equal to said slope differential and mixing said first and second frequency sweep signals.

13. The improved method of claim 10, wherein said slope differential is produced by generating a frequency sweep signal having a frequency versus time slope which is different from slope $s_2$.

* * * * *